United States Patent
Sahu et al.

(10) Patent No.: US 12,546,813 B2
(45) Date of Patent: Feb. 10, 2026

(54) BUILT-IN SELF-TEST SYSTEM AND METHOD FOR CRYSTAL OSCILLATOR AMPLIFIER

(71) Applicant: NXP B.V., Eindhoven (NL)

(72) Inventors: Siyaram Sahu, Bari Raisen (IN); Anand Kumar Sinha, Noida (IN); Ateet Omer, Kanpur (IN)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 18/952,184

(22) Filed: Nov. 19, 2024

(65) Prior Publication Data

US 2025/0180631 A1 Jun. 5, 2025

(30) Foreign Application Priority Data

Nov. 30, 2023 (IN) .............................. 202341081218

(51) Int. Cl.
*G01R 31/28* (2006.01)
*G01R 31/3187* (2006.01)
*H03B 5/36* (2006.01)

(52) U.S. Cl.
CPC ..... *G01R 31/2824* (2013.01); *G01R 31/3187* (2013.01); *H03B 5/364* (2013.01); *H03B 2200/0038* (2013.01)

(58) Field of Classification Search
CPC ....................... G01R 31/2824; G01R 31/3187; G01R 31/00; H03B 5/364; H03B 2200/0038; H03B 2200/0046; H03B 2200/0062; H03B 2201/031
See application file for complete search history.

(56) References Cited

U.S. PATENT DOCUMENTS

| | | | |
|---|---|---|---|
| 8,143,953 B2 | 3/2012 | Von Staudt et al. | |
| 8,816,786 B2 * | 8/2014 | Tham ....................... | H03B 5/06 331/109 |
| 11,152,890 B2 * | 10/2021 | Chakraborty ........ | H03B 5/1234 |
| 2014/0125419 A1 | 5/2014 | Zhang et al. | |
| 2015/0042368 A1 | 2/2015 | Sonnhueter et al. | |
| 2016/0218671 A1 | 7/2016 | Jun et al. | |
| 2019/0353700 A1 | 11/2019 | Ciubotaru | |

* cited by examiner

*Primary Examiner* — Jeffrey M Shin

(57) ABSTRACT

A BIST system and method for a crystal oscillator amplifier including current mirror circuitry, an ADC, a DAC, and test control circuitry. The amplifier includes a current source, a base transistor and a feedback resistor. The ADC converts a self-bias voltage on an input node into a digital bias code during a normal mode when the current source is coupled to the base transistor. During phases of a test mode, the base transistor is coupled instead to the mirror circuitry, which mirrors current through the base transistor into a test resistor. The digital bias code is converted into upper and lower digital bias codes using a delta value, which are converted by the DAC into corresponding bias voltages driven onto the input node during respective phases of the test mode. The ADC converts corresponding test voltages on the test resistor into test codes used to estimate the amplifier transconductance.

20 Claims, 6 Drawing Sheets

BUILT-IN SELF-TEST SYSTEM AND METHOD FOR CRYSTAL OSCILLATOR AMPLIFIER

BACKGROUND

CROSS-REFERENCE TO RELATED APPLICATIONS

This application claims the priority under 35 U.S.C. § 119 of India application Ser. No. 202341081218, filed on 30 Nov. 2023, the contents of which are incorporated by reference herein.

Field

The present disclosure relates in general to crystal oscillator amplifiers, and more particularly to a built-in self-test (BIST) configuration for testing the transconductance of a crystal oscillator amplifier.

Description of the Related Art

Integrated crystal oscillator amplifiers go through various level of characterization and testing to ensure proper functionality. In operation, a crystal oscillator amplifier applies a negative resistance to an external crystal to establish oscillation, in which the level of negative resistance applied is function of the transconductance (gm) of the amplifier. The transconductance should be at least a minimum level or be within a predetermined range to ensure successful oscillation. Thus, the transconductance of a crystal oscillator amplifier is typically tested to identify faulty amplifiers in production testing.

The conventional method of measuring the transconductance of a crystal oscillator amplifier includes at least three measurement steps using hardware instruments including a voltmeter, an Ammeter and a source meter. Such conventional testing performed during production flow has drawbacks since it is costly and time consuming and tends to increase the time to market of a final product.

BRIEF DESCRIPTION OF THE DRAWINGS

Embodiments of the present invention are illustrated by way of example and are not limited by the accompanying figures. Similar references in the figures may indicate similar elements. Elements in the figures are illustrated for simplicity and clarity and have not necessarily been drawn to scale.

DETAILED DESCRIPTION

A crystal oscillator amplifier includes a bias current source, a base transistor, and a feedback resistor. During normal operation, the bias current source provides bias current from a supply voltage to the base transistor at an output node, in which the transistor has a control terminal coupled to an input node. The feedback resistor is coupled between the input and output nodes. The crystal oscillator amplifier generates negative resistance to an externally-coupled crystal, in which the negative resistance is a function of the crystal oscillator amplifier transconductance. A built-in self-test system (BIST) as described herein includes current mirror circuitry that mirrors current flowing through the base transistor into a test resistor developing a test voltage on a test node, a test switch that switches between the bias current source in a normal mode and the current mirror circuitry in a test mode, an analog to digital converter (ADC), a digital to analog converter (DAC), and test control circuitry.

The test control circuitry places the crystal oscillator amplifier in normal mode and prompts the ADC to convert a self-bias voltage developed on the input node to a digital bias code BC. The test control circuitry increments and decrements the digital bias code by a delta value forming an upper digital bias code BC1 and a lower digital bias code BC0. The test control circuitry then places the crystal oscillator amplifier in test mode and prompts the DAC to convert BC1 to a first bias voltage which is driven onto the input node. The current flowing through the base transistor is mirrored by the current mirror circuitry into the test resistor to form a first test voltage VT1, which is converted by the ADC to a first test code TC1. The test control circuitry then prompts the DAC to convert BC0 to a second bias voltage which is driven onto the input node. The current flowing through the base transistor is mirrored by the current mirror circuitry into the test resistor to form a second test voltage VT0, which is converted by the ADC to a second test code TC0. The test control circuitry estimates the transconductance gm of the crystal oscillator amplifier based on a difference between first and second test codes. In addition, the test control circuitry may compare the estimated gm value with a transconductance specification value or range to determine whether the crystal oscillator amplifier passes or fails.

Figure 1:
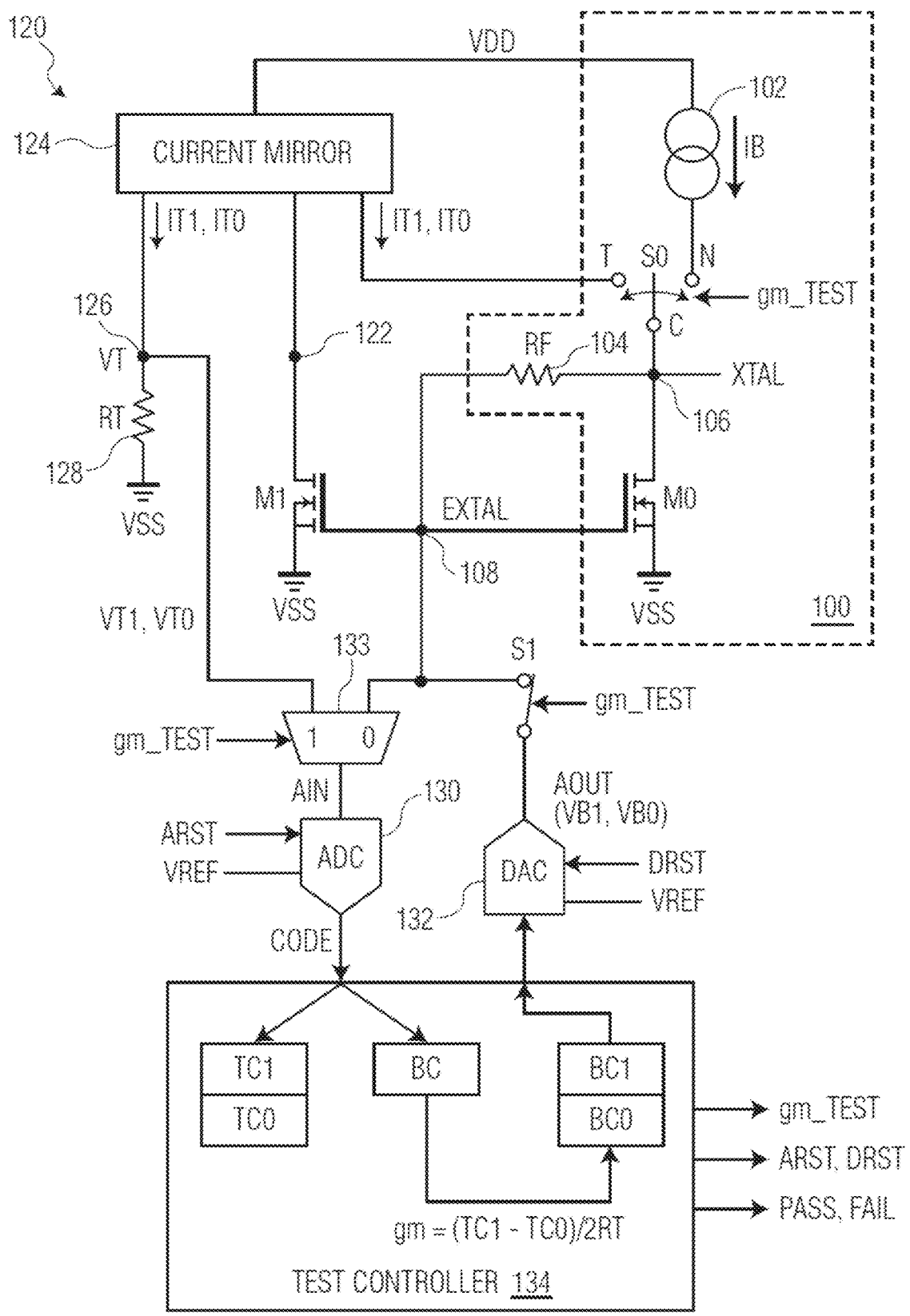
FIG. 1 is a simplified schematic and block diagram of a crystal oscillator amplifier coupled to a built-in self-test (BIST) circuit implemented according to one embodiment for testing the transconductance (gm) of the crystal oscillator amplifier.

FIG. 1 is a simplified schematic and block diagram of a crystal oscillator amplifier 100 coupled to a built-in self-test (BIST) circuit 120 implemented according to one embodiment for testing the transconductance (gm) of the crystal oscillator amplifier 100. The BIST circuit 120 includes a single-pole, double-throw (SPDT) switch S0 having a common terminal labeled "C" and a pair of switched terminals labeled "N" and "T". Switch S0 is controlled by a signal gm_TEST that is "0" in a normal mode in which the N terminal is connected to the C terminal, and that is "1" in a test mode in which the T terminal is connected to the C terminal. The BIST circuit 120 also includes a single-pole, single-throw (SPST) switch S1 that is open in the normal mode (when gm_TEST=0) and closed in the test mode (when gm_TEST=1). The crystal oscillator amplifier 100 includes a bias current source 102, a base transistor M0 configured as an N-type or N-channel MOS (NMOS) transistor or NFET, and a feedback resistor 104 having a resistance RF. Different types of transistors may be used, each including current terminals (e.g., drain and source, emitter and collector) and a control terminal (e.g., gate or base). M0 is shown with an internal bulk connection coupled to its source terminal.

The bias current source 102 has an input coupled to a supply voltage VDD and an output providing a bias current IB to the N terminal of switch S0. The C terminal of switch S0 is coupled to an output node 106 developing an output signal XTAL. M0 has a drain terminal coupled to the output node 106, a source terminal coupled to a supply reference node, such as VSS (which may be any suitable voltage level including ground), and a gate terminal coupled to an input node 108 which develops an input signal EXTAL. The resistor 104 is coupled between the input node 108 and the output node 106.

During the normal mode of operation when the gm_TEST signal=0, the crystal oscillator amplifier 100 is energized to provide a negative resistance to an external crystal (not shown) coupled between EXTAL and XTAL via corresponding input/output (I/O) pins or pads (not shown) causing oscillation. The negative resistance of the crystal oscillator amplifier 100 is a function of its transconductance (gm). The BIST circuit 120 is provided to test the transconductance gm of the crystal oscillator amplifier 100 as further described herein, which is performed without connection of the external crystal.

The BIST circuit 120 includes another N-type or N-channel MOS (NMOS) or NFET transistor M1, which is a replica or duplicate transistor of M0 having substantially the same size and same type or structure. M1 is also shown with an internal bulk connection coupled to its source terminal. M1 has a source terminal coupled to VSS, a gate terminal coupled to the input node 108, and a drain terminal coupled to a mirror node 122. The BIST circuit 120 includes a current mirror circuit 124 coupled to VDD, in which the current mirror circuit 124 has a first terminal coupled to the T terminal of switch S0, a second terminal coupled to the mirror node 122, and a third terminal coupled to a test node 126 developing a test voltage VT. A test resistor 128 with resistance RT is coupled between the test node 126 and VSS.

The BIST circuit 120 further includes an analog to digital converter (ADC) 130 and a digital to analog converter (DAC) 132, both referenced to the same reference voltage VREF, and select circuitry in the form of a 2-input multiplexer (MUX) 133. The MUX 133 has a logic "0" input coupled to the input node 108 for receiving the EXTAL voltage, has a logic "1" input coupled to the test node 126 receiving the test voltage VT, and has an output providing an analog input signal AIN. The ADC 130 has an input receiving AIN and an output providing a digital CODE value provided to an input of a test controller 134. The test controller 134 has an output coupled to the input of the DAC 132. The DAC 132 has an output providing an analog output (AOUT) signal to one switched terminal of the switch S1, which has its other switched terminal coupled to the output node 108.

The test controller 134 provides the gm_TEST signal to control switching between the normal mode and the test mode. The test controller 134 provides a reset signal ARST to reset the ADC 130 and provides another reset signal DRST to reset the DAC 132. It is noted that each reset signal ARST and DRST may be asserted to place the corresponding converter (ADC 130 and DAC 132) in reset, or de-asserted (or negated) to release and prompt the converter to perform a conversion. Each reset signal ARST and DRST may be pulsed (e.g., from negated to asserted and back to negated) to prompt the corresponding converter to perform a new conversion. The switches S0 and S1, the MUX 133, and the test controller 134 collectively form test control circuitry of the BIST circuit 120. As described further herein, the test controller 134 receives and stores first and second test codes TC1 and TC0 during a test operation, estimates the transconductance gm of the crystal oscillator amplifier 100 based on a difference between the test codes TC1 and TC0, evaluates the estimated transconductance gm such as by comparison with a specification or the like, and provides either a PASS notification or a FAIL notification based on the results of the evaluation.

Operation of the BIST circuit 120 for estimating the transconductance gm of the crystal oscillator amplifier 100 is now briefly described. The test controller 134 first places the BIST circuit 120 into the normal mode by asserting the gm_TEST signal to 0. The switch S0 selects its N terminal, the MUX 133 selects the input node 108, and S1 is opened. The bias current IB provided by the bias current source 102 flows through the current terminals of M0 and a self-bias voltage is developed on the input node 108. The input of the ADC 130 receives the analog bias voltage developed on the input node 108 as the input analog voltage AIN. The digital controller 134 prompts the ADC 130, such as by pulsing the ARST signal, to convert AIN to the digital value CODE, which is received by the test controller 134 as a digital bias code (BC). The test controller 134 increments and decrements BC by an incremental digital delta value to provide an upper digital bias code BC1 and a lower digital bias code BC0, respectively. The incremental digital value added to and subtracted from BC to provide BC1 and BC0 may be expressed in terms of a least significant bit (LSB) of the ADC 130 and the DAC 132. In general, the incremental digital value may be 1 or 2 LSB's so that BC is increased to BC1 and decreased to BC0 to provide two separate digital bias codes on either side of BC.

The test controller 134 then asserts the gm_TEST signal to 1 to place the BIST circuit 120 into the test mode. In the test mode, the switch S0 selects its T terminal so that M0 is disconnected from the bias current source 102 and instead coupled to the current mirror circuit 124 via the output node 106, the MUX 133 selects the test node 126 to provide VT as AIN, and the switch S1 is closed to couple the output of the DAC 132 to the input node 108. The test controller 134 then initiates a first phase of the test mode by providing the upper digital bias code BC1 to the DAC 132, and prompts the DAC 132, such as by pulsing DRST, to convert BC1 into a corresponding first bias voltage VB1. The DAC 132 thus applies AOUT as VB1 to the input node 108 via the switch S1. In the first phase of the test mode, a corresponding first test current IT1 flowing through M0 is sensed by the current mirror circuit 124 via M1 and mirrored as a first test current IT1 into the test resistor 128, so that a first test voltage VT1 is developed on the test node 126. The test controller 134 prompts the ADC 130, such as by pulsing ARST, to convert VT1 into a first test code TC1 which is received and stored by the test controller 134.

The test controller 134 then initiates a second phase of the test mode by providing the lower digital bias code BC0 to the DAC 132, and prompts the DAC 132, such as by pulsing DRST again, to convert BC0 into a corresponding second bias voltage VB0. The DAC 132 thus applies AOUT as VB0 to the input node 108 via the switch S1. In the second phase of the test mode, a corresponding second test current IT0 flowing through M0 is sensed by the current mirror circuit 124 via M1 and mirrored as a second test current IT0 into the test resistor 128, so that a second test voltage VT0 is developed on the test node 126. The test controller 134 then prompts the ADC 130, such as by pulsing ARST again, to convert VT0 into a second test code TC0 which is received and stored by the test controller 134.

The test controller 134 may estimate the transconductance gm according to the following equation (1):

$$gm = \frac{\Delta i}{\Delta v} = \frac{IT1 - IT0}{VB1 - VB0} = \frac{\frac{VT1}{RT} - \frac{VT0}{RT}}{2 VSTEP} = \frac{\frac{1}{RT}(TC1 - TC0) VSTEP}{2 VSTEP} = \frac{TC1 - TC0}{2 RT}$$

where VSTEP is the incremental analog voltage conversion of 1 LSB for the ADC 130 and the DAC 132, in which VSTEP is proportional to the reference voltage VREF. Since VSTEP is canceled out of the equation for estimating the gm, VREF may be driven from the supply voltage (VDD, VSS). The test controller 134 may evaluate the estimated transconductance gm by comparing it with a minimum specification value or to determine whether the estimated transconductance gm falls within a specified transconductance range. Based on the results of the evaluation, the test controller 134 may provide either one of the PASS and FAIL notifications.

Figure 2:
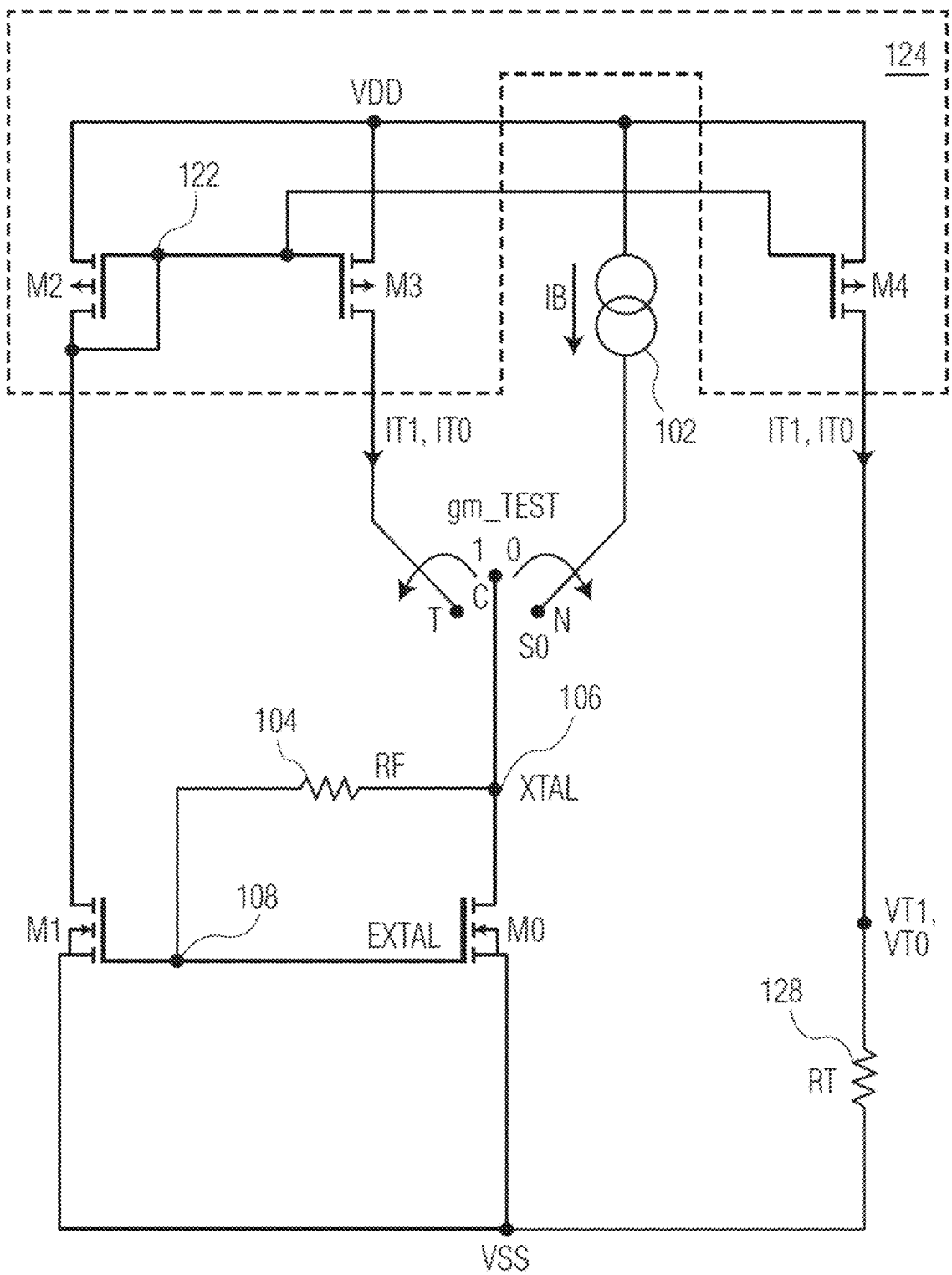
FIG. 2 is a simplified schematic and block diagram of the crystal oscillator amplifier of FIG. 1 illustrating further details of the current mirror circuit implemented according to one embodiment.

FIG. 2 is a simplified schematic and block diagram of the crystal oscillator amplifier 100 illustrating further details of the current mirror circuit 124 of the BIST circuit 120 implemented according to one embodiment. The crystal oscillator amplifier 100 includes the bias current source 102, the base transistor M0 and the feedback resistor 104 coupled in substantially the same manner as shown in FIG. 1. The bias current source 102 is coupled between VDD and the N terminal of the switch S0 in the same manner, in which the C terminal of the switch S0 is coupled to the output node 106 (XTAL). The current mirror circuit 124 includes the duplicate N-type transistor M1 along with additional mirror transistors M2, M3, and M4, which may be configured as P-type MOS transistors or PFETs or the like. M1 has its gate terminal coupled to the input node 108, its source terminal coupled to VSS, and its drain terminal coupled to the mirror node 122. M2, M3, and M4 each have a source terminal coupled to VDD and a gate terminal coupled to the mirror node 122. M2 is diode-biased having its drain and gate terminals coupled together at the mirror node 122. M3 has its drain terminal coupled to the T terminal of the switch S0. M4 has its drain terminal coupled to the test node 126. The test resistor 128 is shown coupled between the test node 126 and VSS in the same manner. The DAC 132 and the switch S1 are copied to show application of the bias voltages VB1 and VB0 during the test mode.

During the normal mode as previously described, the switch S0 transfers the bias current IB from the bias current source 102 through M0 developing an initial self-bias voltage on the input node 108 (EXTAL), which is converted to the digital bias code BC and used to provide the upper and lower digital bias codes BC1 and BC0. During the first phase of the test mode, BC1 is converted and applied as the first analog bias voltage VB1 causing M3 to generate the first test current IT1 through M0, which is mirrored by M4 to flow through the test resistor 128 which develops the first test voltage VT1 on the test node 126. VT1 is converted to TC1 as previously described. During the second phase of the test mode, BC0 is converted and applied as the second analog bias voltage VB2 to the input node 108 causing M3 to generate the second test current IT0 through M0, which is mirrored by M4 to flow through the test resistor 128 which develops the second test voltage VT0 on the test node 126. VT0 is converted to TC0 as previously described.

In one embodiment, the ratio of size of M3 to M4 is 4, the resistance RT of the test transistor 128 is 1 kilo-ohm (K•), and the increment and decrement is 2 LSB's each for a total difference of 4 LSB's. In this manner, the transconductance may be estimated as gm=(TC1−TC0) milliamperes per Volt (mA/V).

Figure 3:
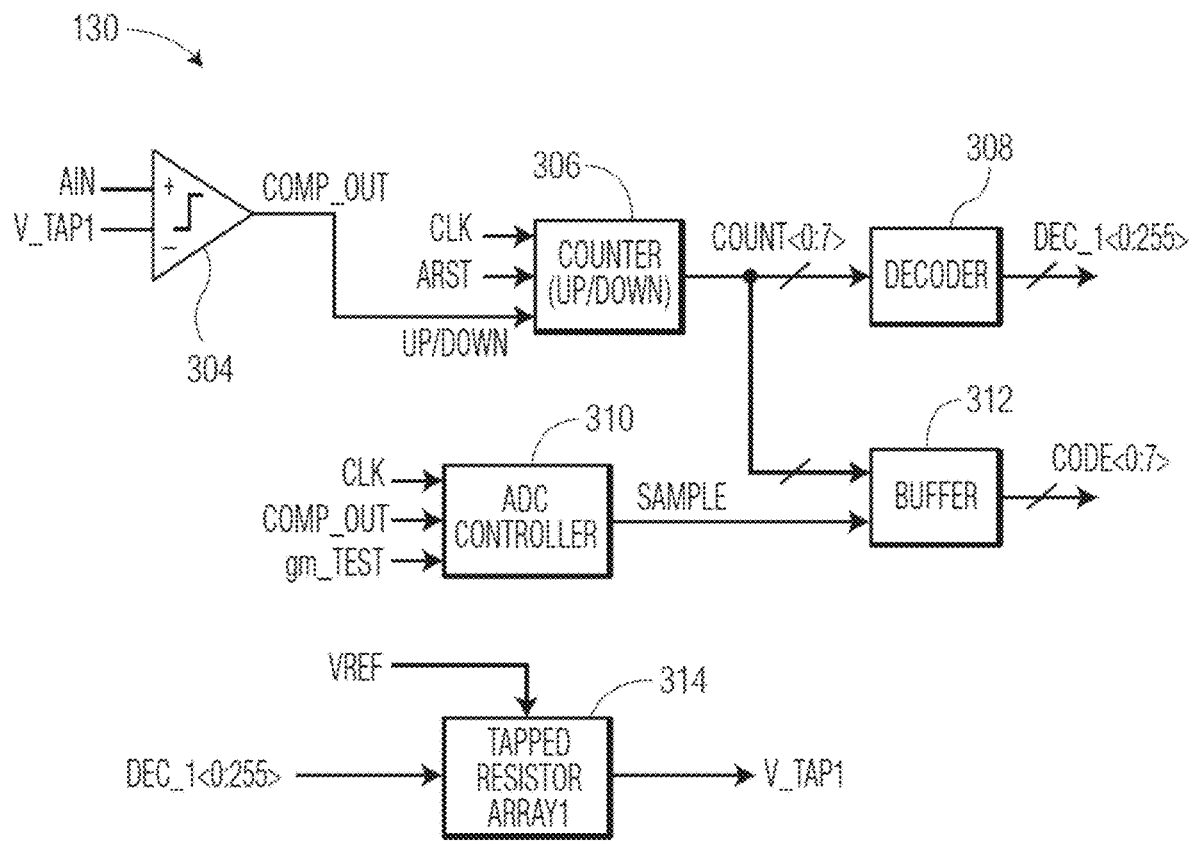
FIG. 3 is a simplified block diagram of the ADC of FIG. 1 implemented according to one embodiment.

FIG. 3 is a simplified block diagram of the ADC 130 implemented according to one embodiment. The illustrated ADC circuit 130 includes a comparator 304, a counter 306, a decoder 308, an ADC controller 310, a buffer 312, and a first tapped resistor array 314. AIN is provided to a positive (non-inverting) input of the comparator 304, which receives an analog voltage V_TAP1 at its negative (inverting) input and which provides a COMP_OUT signal at its output. COMP_OUT is provided to an input of the counter 306, which outputs a COUNT value to an input of the decoder 308 and to an input of the buffer 312. The decoder 308 outputs a decoded decimal value DEC_1 to an input of the tapped resistor array 314, which outputs the V_TAP1 voltage as a converted voltage representing a value of DEC_1. When sampled, the buffer 312 stores the COUNT value as the output CODE value.

In one embodiment, the counter 306 is an 8-bit up/down counter receiving a clock signal CLK and providing COUNT as an 8-bit count value COUNT<0:7>. The counter 306 sets or holds COUNT<0:7> to zero while ARST is asserted. The decoder 308 converts COUNT<0:7> into a 256-bit decoded decimal value DEC_1<0:255> in which only 1 bit is set to 1 at a time indicative of the binary value of COUNT<0:7>. The tapped resistor array 314 converts the decimal value of DEC_1<0:255> to the corresponding voltage V_TAP1 based on VREF. The ADC controller 310 receives CLK, COMP_OUT and gm_TEST and provides a signal SAMPLE to the buffer 312 to store the current value of COUNT<0:7> as a corresponding 8-bit CODE<0:7> value provided to the test controller 134. CODE is provided as the digital bias code BC during the normal mode (gm_TEST=0), in which the test controller 134 uses BC to generate the upper and lower digital bias codes BC1 and BC0. CODE is provided as the first test code TC1 during the first phase of the test mode and is provided as the second test code TC0 during the second phase of the test mode. After TC1 and TC0 are determined, the test controller 134 estimates the transconductance gm of the crystal oscillator amplifier 100 as previously described.

In operation of the ADC circuit 130, the test controller 134 asserts gm_TEST to 0 for the normal mode and prompts the ADC controller 310 to initiate measurement, such as by pulsing ARST to reset the counter 306 to set COUNT to zero. When COUNT is zero, the decoded decimal value DEC_1 causes the tapped resistor array 314 to assert V_TAP1 at or near zero. AIN is compared by the comparator 304 with V_TAP1 to generate COMP_OUT. Initially when V_TAP1 is zero, COMP_OUT is asserted high (to a logic 1 value) causing the counter 306 to count up so that COUNT is incremented in each of successive CLK cycles. The decoder 308 converts the COUNT value to the decoded decimal value DEC_1 which causes the tapped resistor array 314 to incrementally increase the voltage of V_TAP1 with successive cycles of CLK. When V_TAP1 reaches (or otherwise exceeds) AIN, which is the voltage of EXTAL during the normal mode, the controller 310 toggles SAMPLE causing the buffer 312 to store COUNT as the output CODE value. CODE is provided as BC to the test controller 134 as previously described.

Operation is substantially the same during the first and second phases of the test mode. The test controller 134 asserts gm_TEST to 1 for the test mode and provides BC1 during the first phase as previously described. In the first phase, the test node 126 develops the corresponding first test voltage VT1 which is provided as AIN to the ADC 130. The test controller 134 prompts the ADC 132, such as by pulsing ARST, so that the ADC 132 converts VT1 to a corresponding CODE value provided as TC1 to the test controller 134. The test controller 134 provides BC0 in the second phase in which the test node 126 develops the corresponding second test voltage VT0 which is provided as AIN to the ADC 130. The test controller 134 prompts the ADC 132, such as by pulsing ARST, so that the ADC 132 converts VT0 to a corresponding CODE value provided as TC0 to the test controller 134.

Figure 4:
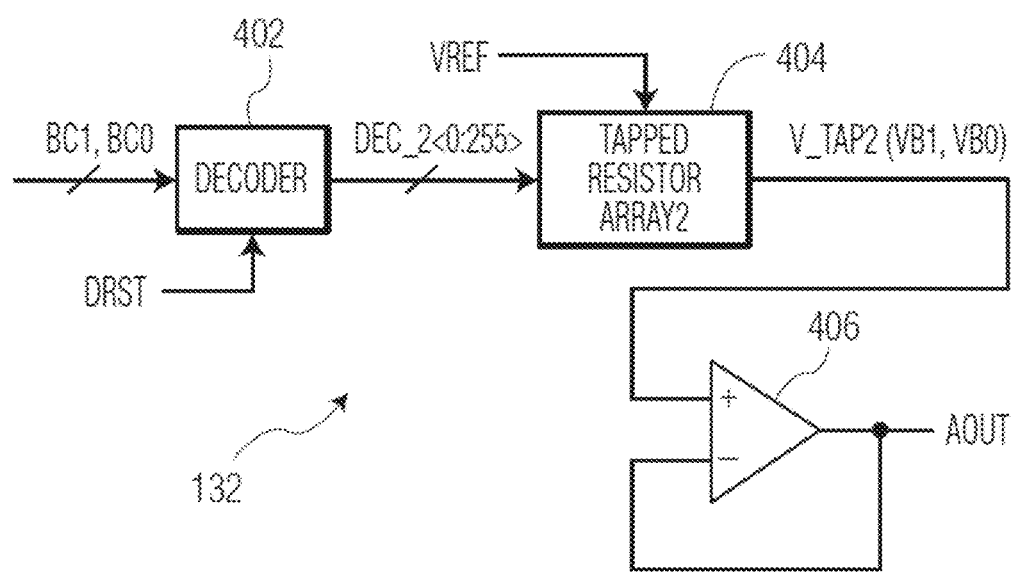
FIG. 4 is a simplified block diagram of the DAC of FIG. 1 implemented according to one embodiment.

FIG. 4 is a simplified block diagram of the DAC 132 implemented according to one embodiment. The illustrated DAC circuit 132 includes a decoder 402, a second tapped resistor array 404, and an amplifier 406. The decoder 402 operates in substantially the same manner as the decoder 308, except that it receives DRST provided by the test controller 134. The digital bias codes BC1 and BC0 values may each be provided as 8-bit values (each derived from the COUNT value as previously described), in which the decoder 402 converts each 8-bit value into a 256-bit decoded decimal value DEC_2<0:255> in which only 1 bit is set to 1 at a time indicative of the decimal value of the respective digital bias code. The second tapped resistor array 404 is configured in substantially identical manner as the first tapped resistor array 314 each referenced to VREF. The tapped resistor array 404 converts the decoded decimal value of BC1 or BC0 (via DEC_2) to a corresponding voltage V_TAP2 based on VREF, in which V_TAP2 is a converted voltage representing a value of DEC_2. V_TAP2 is provided to a positive (non-inverting) input of the amplifier 406, having its negative (inverting) input coupled to its output which provides the output analog signal AOUT. The amplifier 406 is configured as a unity-gain buffer to drive the voltage level of V_TAP2 as AOUT onto the input node 108 during the first and second phases of the test mode.

In operation, the test controller 134 provides the upper digital bias code BC1 to the DAC circuit 132 during the first phase of the test mode. The test controller 134 pulses the DRST signal, and the decoder 402 and the tapped resistor array 404 convert BC1 to the analog bias voltage VB1. VB1 is driven onto the input node 108 by the amplifier 406. The ADC circuit 130 converts VT1 to TC1 as previously described. Then the test controller 134 provides the lower digital bias code BC0 to the DAC circuit 132 for the second phase of the test mode, and prompts the DAC 132 by pulsing DRST. The decoder 402 and the tapped resistor array 404 convert BC0 to the analog bias voltage VB0, which is driven onto the input node 108 by the amplifier 406. The ADC circuit 130 converts VT0 to TC0 as previously described.

Figure 5:
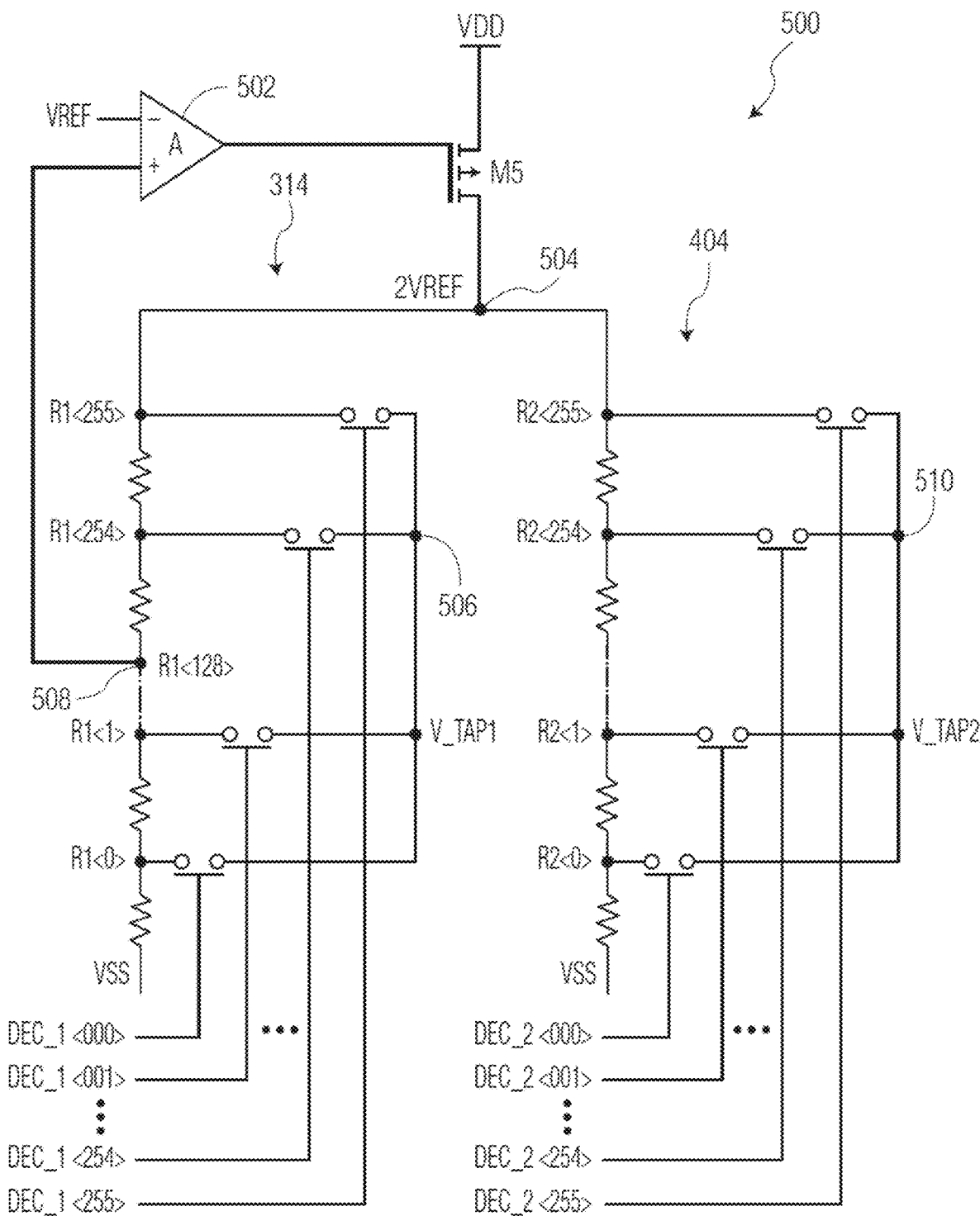
FIG. 5 is a schematic diagram of a tapped resistor array circuit according to one embodiment which may be used to implement the first and second tapped resistor arrays of FIGS. 3 and 4.

FIG. 5 is a schematic diagram of a tapped resistor array circuit 500 according to one embodiment which may be used to implement the first and second tapped resistor arrays 314 and 404. The tapped resistor array circuit 500 includes an amplifier 502 having a negative (inverting) input receiving VREF and an output coupled to a gate terminal of another P-type transistor M5. M5 has a source terminal coupled to VDD and a drain terminal coupled to an upper node 504. The first tapped resistor array 314 includes a first array of substantially equal resistors (e.g., each having about the same resistance) coupled in series between the upper node 504 and VSS forming a corresponding first array of intermediate nodes. The first tapped resistor array 314 also includes a corresponding first array of SPST switches, each having a first terminal coupled to first common node 506 developing the voltage V_TAP1 and a second terminal coupled to a corresponding one of the array of first intermediate nodes of the first array of resistors. Each of the first array of SPST switches has a control terminal receiving a corresponding bit of the decoded decimal value DEC_1. A center node 508 of the first array of resistors is coupled to the positive (non-inverting) input of the amplifier 502, in which half the resistors are coupled in series between the center node 508 and VSS and the other half are coupled in series between the nodes 504 and 506. Thus, the amplifier 502 drives the voltage of the center node 508 to VREF, such that the upper node 504 develops twice the voltage 2VREF. In this manner, the first array of resistors divides the voltage 2VREF by substantially equal increments based on the number of resistors.

The second tapped resistor array 404 is configured in a similar manner as the first tapped resistor array 314. The second tapped resistor array 404 includes a second array of substantially equal resistors (e.g., each having the same resistance) coupled in series between the upper node 504 and VSS forming a corresponding second array of intermediate nodes. The second tapped resistor array 404 also includes a corresponding second array of SPST switches, each having a first terminal coupled to second common node 510 developing the voltage V_TAP2 and a second terminal coupled to a corresponding one of the array of second intermediate nodes of the second array of resistors. Each of the second array of SPST switches has a control terminal receiving a corresponding bit of the decoded decimal value DEC_2. Since the second array of resistors is coupled between node 504 and VSS, the second array of resistors also divides the voltage 2VREF by substantially equal increments based on the number of resistors.

The resistance of each resistor of the first and second arrays of resistors are substantially equal, so that the first and second tapped resistor arrays 314 and 404 are substantially equivalent based on the reference voltage VREF. With reference to FIGS. 3 and 5, the counter 306 adjusts the COUNT value which is converted by the decoder 308 to a corresponding value of DEC_1 that selects a corresponding one of the first intermediate nodes of the first tapped resistor array 314 to provide a corresponding voltage of V_TAP1 until V_TAP1 is substantially equal to AIN. In this manner, the COUNT value is a digital representation of AIN, which is a voltage of EXTAL in the normal mode or the voltages VT1 or VT0 during the first or second phases of the test mode. With reference to FIGS. 4 and 5, the upper and lower digital bias codes BC1 and BC0 are converted by the decoder 402 to a corresponding value of DEC_2 that selects a corresponding one of the second intermediate nodes of the second tapped resistor array 404 to provide a corresponding one of the bias voltages VB1 and VB0, respectively, used to generate the test voltages VT1 and VT0, respectively, during the first and second phases of the test mode as previously described. The test voltages VT1 and VT0 are converted to the first and second test codes TC1 and TC0 using the first tapped resistor array 314 as previously described.

In one embodiment, the first array of resistors includes 256 resistors R1<0:255> forming 256 intermediate nodes each coupled to a corresponding one of the first array of 256 SPST switches, each controlled by a corresponding bit of DEC_1<0:255>. In this manner, 2VREF is divided into 256 substantially equal voltage increments selected by DEC_1<0:255>. Also, the second array of resistors includes 256 resistors R2<0:255> forming 256 intermediate nodes each coupled to a corresponding one of the second array of 256 SPST switches, each controlled by a corresponding bit of DEC_2<0:255>. In this manner, 2VREF is also divided into 256 substantially equal voltage increments selected by DEC_2<0:255>.

Figure 6:
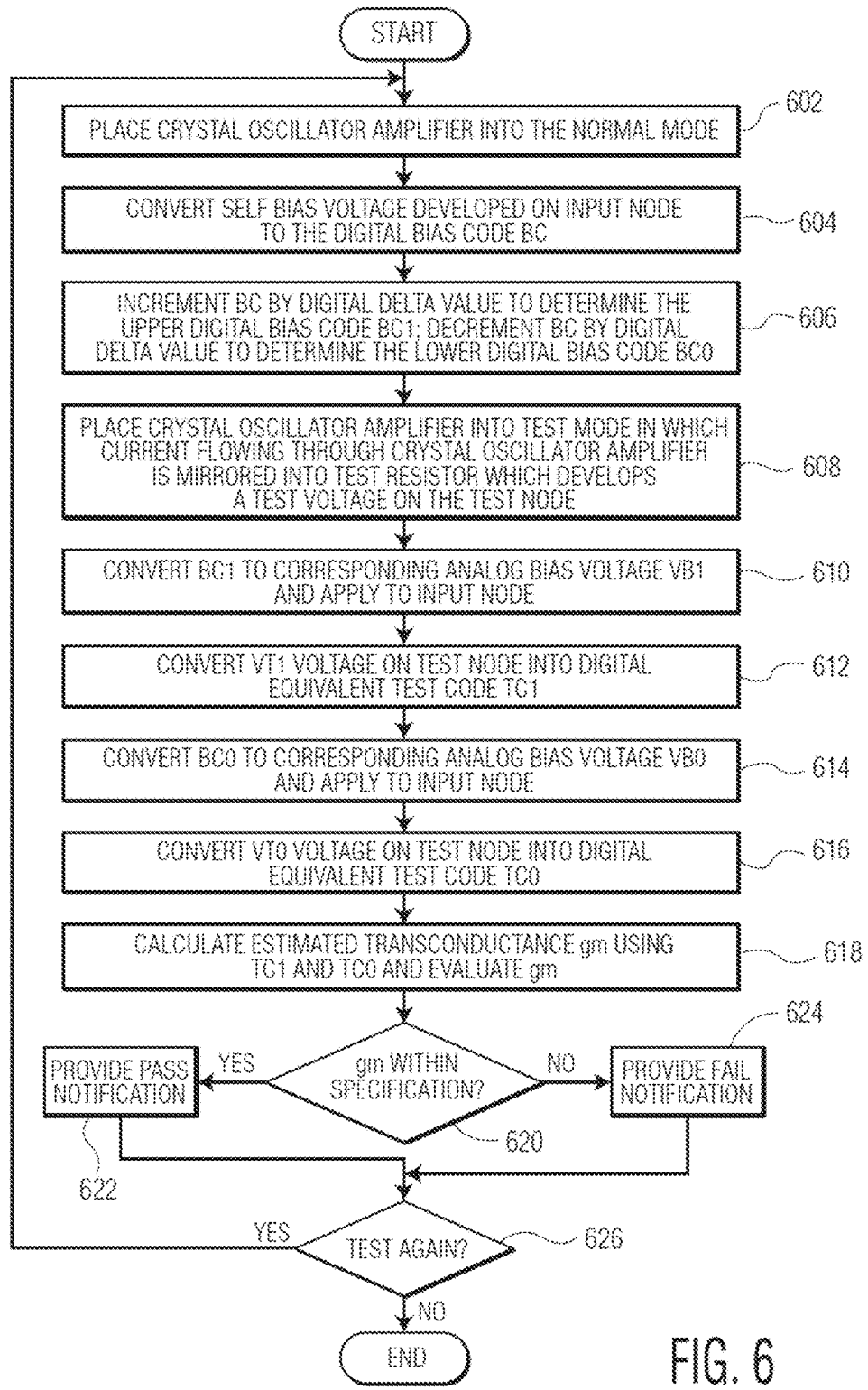
FIG. 6 is a flowchart diagram illustrating operation of the BIST circuit of FIG. 1 according to one embodiment.

FIG. 6 is a flowchart diagram illustrating operation of the BIST circuit 120 according to one embodiment. The test controller 134 generally controls the test mode of operation by controlling the gm_TEST signal, by prompting the ADC 130 and the DAC 132 via the ARST and DRST signals, respectively, and by performing various calculations. At a first block 602, the test controller 134 of the BIST circuit 120 places the crystal oscillator amplifier 100 into the normal mode, such as by asserting gm_TEST to 0. At next block 604, the BIST circuit 120 converts a self-bias voltage developed on the input node 108 into the digital bias code BC. At next block 606, BC is incremented by a digital delta value to determine the upper digital bias code BC1, and BC is also decremented by the digital delta value to determine the lower digital bias code BC0. In one embodiment, the test controller 134 is configured to derive BC1 and BC0 based on BC. At next block 608, the test controller 134 of the BIST circuit 120 places the crystal oscillator amplifier 100 into the test mode, such as by asserting gm_TEST to 1. In the test mode, the current flowing through the base transistor M0 of the crystal oscillator amplifier 100 is mirrored into the test resistor 128 which develops a corresponding test voltage VT on the test node 126.

Next block 610 begins the first phase of the test mode. At block 610, the test controller 134 prompts the DAC 132 to convert BC1 into the first analog bias voltage VB1, which is applied via switch S1 to the input node 108 of the crystal oscillator amplifier 100. At next block 612, the test controller 134 prompts the ADC 130 to convert the test voltage VT1 developed on the test node 126 into the digital equivalent test code TC1, which is received and stored by the test controller 134. Next block 614 begins the second phase of the test mode. At next block 614, the test controller 134 prompts the DAC 132 to convert BC0 into the second analog bias voltage VB0, which is applied via switch S1 to the input node 108 of the crystal oscillator amplifier 100. At next block 616, the test controller 134 prompts the ADC 130 to convert the test voltage VT0 developed on the test node 126 into the digital equivalent test code TC0, which is received and stored by the test controller 134. At next block 618, the test controller 134 calculates the estimated transconductance gm using the test codes TC1 and TC0 as previously described, in which the transconductance gm may then be evaluated by the test controller 134. In one embodiment, such evaluation is a comparison with a gm specification, such as whether gm is at least a minimum value or falls within a predetermined acceptable range of gm values. At next block 620, it is queried whether the gm value falls within the requisite specification, such as a range of acceptable gm values. If so, operation proceeds to block 622 in which the PASS notification is provided by the test controller 134. If not, operation proceeds to block 624 in which the FAIL notification is provided by the test controller 134. Additional remedial steps may be taken if desired. From either block 622 or 624, operation advances to a block 626 to inquire whether another test is to be performed. If not, operation is completed. Otherwise, operation loops back to block 602 in which the entire process is repeated.

Although the present invention has been described in connection with several embodiments, the invention is not intended to be limited to the specific forms set forth herein. On the contrary, it is intended to cover such alternatives, modifications, and equivalents as can be reasonably included within the scope of the invention as defined by the appended claims. For example, variations of positive circuitry or negative circuitry may be used in various embodiments in which the present invention is not limited to specific circuitry polarities, device types or voltage or error levels or the like. For example, circuitry states, such as circuitry low and circuitry high may be reversed depending upon whether the pin or signal is implemented in positive or negative circuitry or the like. In some cases, the circuitry state may be programmable in which the circuitry state may be reversed for a given circuitry function.

The terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements.

We claim:

1. A built-in self-test system for a crystal oscillator amplifier, the crystal oscillator amplifier comprising a bias current source that sources current from a supply voltage, a base transistor having current terminals coupled between an output node and a supply reference node and having a control terminal coupled to an input node, and a feedback resistor coupled between the input and output nodes, the built-in self-test system comprising:

current mirror circuitry that can mirror current through the current terminals of the base transistor into a test resistor coupled to a test node during first and second phases of a test mode;

test control circuitry comprising a test switch controlled by a test mode signal to couple the output node to the bias current source during a normal mode and to couple the output node to the current mirror circuitry during the test mode;

an analog to digital converter that can convert a self-bias voltage developed on the input node during the normal mode into a digital bias code, that can convert a first test voltage on the test node into a first test code during the first phase of the test mode, and that can convert a second test voltage on the test node into a second test code during the second phase of the test mode;

the test control circuitry further comprising a test controller that can provide the test mode signal to switch between the normal and test modes, and that can increment and decrement the digital bias code by a delta value to provide an upper digital bias code and a lower digital bias code during the first and second phases, respectively, of the test mode; and a digital to analog converter that can convert the upper digital bias code to a first bias voltage that is driven onto the input node during the first phase of the test mode, and that can convert the lower digital bias code to a second bias voltage that is driven onto the input node during the second phase of the test mode.

2. The built-in self-test system of claim 1, wherein the current mirror circuitry comprises:
a first transistor that is a duplicate of the base transistor having current terminals coupled between a mirror node and the supply reference node and having a control terminal coupled to the input node;
a second transistor having current terminals coupled between the supply voltage and the mirror node and having a control terminal coupled to the mirror node;
a third transistor having current terminals coupled between the supply voltage and the test switch and having a control input coupled to the mirror node; and
a fourth transistor having current terminals coupled between the supply voltage and the test node and having a control input coupled to the mirror node.

3. The built-in self-test system of claim 1, wherein:
the test control circuitry further comprises select circuitry controlled by the test mode signal to select the input node during the normal mode and to select the test node during the test mode to provide an analog input voltage; and
wherein the analog to digital converter comprises:
a comparator that is configured to compare the analog input voltage with a tap voltage to provide a comparison value;
a counter that is configured to adjust a digital count value based on the comparison value;
a decoder that is configured to decode the digital count value into a decimal value;
a converter that is configured to convert the decimal value into the tap voltage; and
a buffer that stores the digital count value when the comparison value indicates that the tap voltage equals the analog input voltage.

4. The built-in self-test system of claim 3, wherein the converter comprises:
an array of resistors coupled in series between a pair of reference voltage nodes and forming a plurality of intermediate nodes; and
a plurality of tap switches, each having switched terminals coupled between a corresponding one of the plurality of intermediate nodes and a common node that develops the tap voltage, wherein each of the plurality of tap switches has a control terminal controlled by a corresponding bit of the decimal value.

5. The built-in self-test system of claim 1, wherein the test controller is configured to prompt the analog to digital converter during the normal mode to convert the input voltage to the digital bias code, to prompt the analog to digital converter during the first phase of the test mode to convert the first test voltage to the first test code, and to prompt the analog to digital converter during the second phase of the test mode to convert the second test voltage to the second test code.

6. The built-in self-test system of claim 1, wherein:
the test control circuitry comprises a switch controlled by the test mode signal to an output of the digital to analog converter to the input node during the test mode; and
wherein the test controller is configured to prompt the digital to analog converter to convert the upper digital bias code to the first bias voltage during the first phase of the test mode, and to prompt the digital to analog converter to convert the lower digital bias code to the second bias voltage during the second phase of the test mode.

7. The built-in self-test system of claim 1, wherein the digital to analog converter comprises:
a decoder that is configured to decode a selected one of the upper digital bias code and the low digital bias code into a decimal value;
a converter that is configured to convert the decimal value into a converted voltage; and
a buffer that is configured to buffer the converted voltage as a selected one of the first bias voltage and the second bias voltage.

8. The built-in self-test system of claim 7, wherein the converter comprises:
an array of resistors coupled in series between a pair of reference voltage nodes and forming a plurality of intermediate nodes; and
a plurality of tap switches, each having switched terminals coupled between a corresponding one of the plurality of intermediate nodes and a common node that develops the converted voltage, wherein each of the plurality of tap switches has a control terminal controlled by a corresponding bit of the decimal value.

9. The built-in self-test system of claim 1, wherein the test control circuitry is configured to estimate transconductance of the crystal oscillator amplifier based on a difference between the first and second test codes.

10. The built-in self-test system of claim 1, wherein the test control circuitry is configured to evaluate a determined estimate of the transconductance of the crystal oscillator amplifier and provide a selected one of a pass notification and a fail notification.

11. A method of built-in self-testing a crystal oscillator amplifier, the crystal oscillator amplifier comprising a bias current source that sources bias current from a supply voltage, a base transistor having current terminals coupled between an output node and a supply reference node and having a control terminal coupled to an input node, and a feedback resistor coupled between the input and output nodes, the method comprising:
coupling the output node to the bias current source to source the bias current through the current terminals of the base transistor during a normal mode and converting a self-bias voltage developed on the input node during the normal mode into a digital bias code;
coupling the output node to mirror circuitry during a test mode and mirroring current through the current terminals of the base transistor into a test resistor coupled to a test node during a test mode;
incrementing the digital bias code by a delta value to provide an upper digital bias code, converting the upper digital bias code to a first bias voltage, and driving the first bias voltage to the input node during a first phase of the test mode;
decrementing the digital bias code by the delta value to provide a lower digital bias code, converting the lower digital bias code to a second bias voltage, and driving the second bias voltage to the input node during a second phase of the test mode; and
converting a first test voltage on the test node into a first test code during the first phase of the test mode, and converting a second test voltage on the test node into a second test code during the second phase of the test mode.

12. The method of claim 11, wherein the coupling the output node to mirror circuitry during the test mode and mirroring current comprises:
providing a duplicate transistor of the base transistor having current terminals coupled between the mirror circuitry and the supply reference node and having a control terminal coupled to the input node; and using, by the mirror circuitry, the duplicate transistor to mirror current through the current terminals of the base transistor into the test resistor during a test mode.

13. The method of claim 11, wherein the converting the self-bias voltage into a digital bias code during the normal mode, the converting a first test voltage into a first test code during the first phase of the test mode, and the converting a second test voltage into a second test code during the second phase of the test mode, comprises:
- selecting the input node during the normal mode and selecting the test node during the test mode to provide an analog input voltage;
- comparing the analog input voltage with a converted voltage to provide a comparison value;
- adjusting a digital count value based on the comparison value;
- decoding the digital count value into a decimal value;
- converting the decimal value into the converted voltage; and
- storing the digital count value when the comparison value indicates that the converted voltage equals the analog input voltage.

14. The method of claim 13, wherein the converting comprises:
- coupling an array of resistors in series between a pair of reference voltage nodes and forming a plurality of intermediate nodes;
- coupling switched terminals a plurality of tap switches between a corresponding one of the plurality of intermediate nodes and a common node that develops the converted voltage; and
- controlling the plurality of tap switches by a corresponding bit of the decimal value.

15. The method of claim 11, further comprising:
- prompting an analog to digital converter to convert the self-bias voltage developed on the input node during the normal mode into the digital bias code;
- prompting the analog to digital converter to convert the first test voltage to the first test code during the first phase of the test mode; and
- prompting the analog to digital converter to convert the second test voltage to the second test code during the second phase of the test mode.

16. The method of claim 11, further comprising:
- prompting a digital to analog converter to convert the upper digital bias code to the first bias voltage during the first phase of the test mode;
- driving the first bias voltage onto the input node during the first phase of the test mode;
- prompting the digital to analog converter to convert the lower digital bias code to the second bias voltage during the second phase of the test mode; and
- driving the first bias voltage onto the input node during the first phase of the test mode.

17. The method of claim 11, wherein the converting the upper digital bias code to a first bias voltage and driving the first bias voltage to the input node during a first phase of the test mode and the converting the lower digital bias code to a second bias voltage, and driving the second bias voltage to the input node during a second phase of the test mode each comprises:
- decoding a selected one of the upper digital bias code and the low digital bias code into a decimal value;
- converting the decimal value into a converted voltage; and
- buffering the converted voltage as a selected one of the first bias voltage and the second bias voltage.

18. The method of claim 17, wherein the converting comprises:
- coupling an array of resistors in series between a pair of reference voltage nodes and forming a plurality of intermediate nodes;
- coupling switched terminals a plurality of tap switches between a corresponding one of the plurality of intermediate nodes and a common node that develops the converted voltage; and
- controlling the plurality of tap switches by a corresponding bit of the decimal value.

19. The method of claim 10, further comprising estimating transconductance of the crystal oscillator amplifier based on a difference between the first and second test codes.

20. The method of claim 11, further comprising evaluating a determined estimate of the transconductance of the crystal oscillator amplifier and providing a selected one of a pass notification and a fail notification.

* * * * *